(12) United States Patent
Wang et al.

(10) Patent No.: US 10,643,775 B2
(45) Date of Patent: May 5, 2020

(54) CONTROL UNIT AND METHOD FOR MONITORING THE FUNCTION OF AN ELECTROMAGNETIC ACTUATOR

(71) Applicant: SCHAEFFLER TECHNOLOGIES AG & CO. KG, Herzogenaurach (DE)

(72) Inventors: Weigang Wang, Nuremberg (DE); Piergiacomo Traversa, Nuremberg (DE); Michael Elicker, Adelsdorf (DE)

(73) Assignee: SCHAEFFLER TECHNOLOGIES AG & CO. KG, Herzogenaurach (DE)

( * ) Notice: Subject to any disclaimer, the term of this patent is extended or adjusted under 35 U.S.C. 154(b) by 79 days.

(21) Appl. No.: 15/761,976

(22) PCT Filed: Sep. 15, 2016

(86) PCT No.: PCT/DE2016/200433
§ 371 (c)(1),
(2) Date: Mar. 21, 2018

(87) PCT Pub. No.: WO2017/050331
PCT Pub. Date: Mar. 30, 2017

(65) Prior Publication Data
US 2018/0268978 A1  Sep. 20, 2018

(30) Foreign Application Priority Data
Sep. 21, 2015 (DE) .................. 10 2015 218 091

(51) Int. Cl.
*H01F 7/18* (2006.01)
*F16K 37/00* (2006.01)
(Continued)

(52) U.S. Cl.
CPC ....... *H01F 7/1844* (2013.01); *F16K 31/0675* (2013.01); *F16K 37/0083* (2013.01); *G01R 31/3278* (2013.01); *H01F 2007/1861* (2013.01)

(58) Field of Classification Search
CPC ......... G01R 31/3278; H01F 2007/1861; H01F 7/1844; F16K 31/0675
See application file for complete search history.

(56) References Cited

U.S. PATENT DOCUMENTS 5,045,766 A * 9/1991 Vermersch ................ H01F 7/18
                                                        318/257
5,182,517 A    1/1993 Thelen et al.
(Continued)

FOREIGN PATENT DOCUMENTS

CN    103119271 A    5/2013
CN    103518241 A    1/2014
(Continued)

OTHER PUBLICATIONS

International Search Report and Written Opinion for Application No. PCT/DE2016/200433, dated Feb. 14, 2017, 5 Pages.
(Continued)

*Primary Examiner* — Dominic E Hawkins
(74) *Attorney, Agent, or Firm* — Brooks Kushman P.C.

(57) ABSTRACT

A magnetic core and an electric coil, wherein the magnetic core is configured to move by supplying current to the electric coil to allow electrical energy to be transformed into mechanical energy and an electromagnetic actuator operates a valve body to move, and a controller configured to measure a current flowing through the electric coil, select a temporal evaluation section of a course of the current, wherein the current changes from a current value at a beginning of the temporal section to a current value at an end of the section, wherein the evaluation section lasts for a duration period, form an evaluation product from at least the current value at the beginning of the section, the current value at the end of the section, and the duration period of the section, and detect an error function of the actuator by (Continued)

comparing the evaluation product with an evaluation product limit.

14 Claims, 5 Drawing Sheets

(51) Int. Cl.
 *F16K 31/06* (2006.01)
 *G01R 31/327* (2006.01)

(56) References Cited

U.S. PATENT DOCUMENTS

| | | | |
|---|---|---|---|
| 5,548,210 A | 8/1996 | Dittrich | |
| 6,285,151 B1 * | 9/2001 | Wright | F01L 9/04 123/90.11 |
| 8,390,305 B2 * | 3/2013 | Herrera | F03G 7/065 324/691 |
| 2004/0016461 A1 * | 1/2004 | Qu | G05B 19/19 137/554 |
| 2005/0146408 A1 * | 7/2005 | Traversa | F02D 41/20 335/220 |
| 2005/0279867 A1 * | 12/2005 | Ismailov | F02D 41/20 239/585.1 |
| 2009/0132180 A1 * | 5/2009 | Pearce | F02D 41/20 702/38 |
| 2010/0217545 A1 | 8/2010 | Rajagopalan et al. | |
| 2011/0163769 A1 | 7/2011 | Herrera et al. | |
| 2012/0249166 A1 | 10/2012 | Schmidtlein et al. | |
| 2013/0169287 A1 * | 7/2013 | Fink | G01R 31/3275 324/511 |
| 2013/0197837 A1 | 8/2013 | Rosel | |
| 2014/0091516 A1 | 4/2014 | Koch et al. | |
| 2015/0184699 A1 * | 7/2015 | Kato | F16D 27/118 192/69 |

FOREIGN PATENT DOCUMENTS

| | | |
|---|---|---|
| DE | 3942836 A1 | 6/1991 |
| DE | 10232358 A1 | 2/2004 |
| DE | 102009001400 A1 | 9/2010 |
| DE | 102013213329 A1 | 1/2015 |
| DE | 102014203686 A1 | 9/2015 |

OTHER PUBLICATIONS

Chinese Office Action for Application No. 201680062912.9, dated Aug. 23, 2019, 9 pages.

* cited by examiner

CONTROL UNIT AND METHOD FOR MONITORING THE FUNCTION OF AN ELECTROMAGNETIC ACTUATOR

CROSS-REFERENCE TO RELATED APPLICATIONS

This application is the U.S. National Phase of PCT/DE2016/200433 filed Sep. 15, 2016, which claims priority to DE 102015218091.3 filed Sep. 21, 2015, the entire disclosures of which are incorporated by reference herein.

TECHNICAL FIELD

The present disclosure initially relates to a method for monitoring the function of an electromagnetic actuator. The electromagnetic actuator can e.g. refer to a control valve. The function of the electromagnetic actuator can be particularly inhibited in that the electromagnetic actuator is blocked. The disclosure furthermore relates to a control unit for regulating and monitoring an electromagnetic actuator.

BACKGROUND

The US 2011/0163769 A1 presents a method for detecting at least one middle lift position of a load that is actuated by an active material element. In this middle lift position, the material element experiences a load change.

A method for detecting the reaching of a locking position of an electromagnetic control valve is known from the US 2005/0146408 A1, in which the current, which flows after a deactivation of the control valve, is evaluated.

The DE 10 2013 213 329 A1 expounds a method for detecting the function of a control valve, which comprises a magnetic core and a valve body that runs within a coil, which is moved in axial direction by the magnetic core as well as the coil that is supplied with a current. By using this method, the course of the current is detected that is induced in the coil by the magnetic core, while it is not supplied with a current. The induced course of the current is evaluated with regard to the form of the oscillation or height of the induced current.

SUMMARY

Based on the prior art, it is the objective of the present disclosure that it is possible to monitor the function of the electromagnetic actuator in a more precise manner, so that blockages of the electromagnetic actuator can be detected in a more secure manner.

The mentioned objective is achieved by an electromagnetic actuator according to the disclosure below.

The method according to the disclosure is used for the monitoring of the function of an electromagnetic actuator. The electromagnetic actuator may refer to a control valve, which is used e.g. in an automobile, in a chemical facility, in an energy-technological facility, in a machine or in a medical-technical facility. The control valve can particularly be designed for a combustion engine of a motor vehicle. The electromagnetic actuator can also refer to e.g. a lifting magnet. The correct function of the electromagnetic actuator is monitored by the method according to the disclosure, so that possible errors and/or defects of the actuator and possible errors and/or defects of an element that is operated by the actuator can be detected. It is particularly possible to detect mechanical blockages of the actuator by the method according to the disclosure.

The electromagnetic actuator comprises a magnetic core and an electric coil, within which the magnetic core is arranged. The magnetic core can be moved by supplying a current to the electric coil, so that electric energy is transformed into mechanical energy and the electromagnetic actuator operates the element that is to be moved. The magnetic core may be moved in axial direction of the electric coil within the electric coil. An actuator element is attached to the magnetic core, which is moved by the magnetic core. The actuator element may refer to a valve body, if the actuator is formed by a control valve.

In one step of the method according to the disclosure, a measuring of a temporally varying current flowing through the coil is carried out. This measuring is particularly carried out while the electric coil is supplied with a current and/or after the electric coil is supplied with a current.

In a further step of the method according to the disclosure, a selecting of the temporal evaluation section of the course of the measured current is carried out. In this evaluation section, the current changes from a current value at the beginning of the section $I_a$ to a current value at the end of the section $I_b$, wherein this change occurs in a monotonous manner. This monotonous change can be formed by a monotonous increase or by a monotonous decrease. The monotonous change can be interrupted by neglectable variations of the current. The temporal evaluation section lasts for a sectional duration period of $t_{ab}$. The current within the evaluation section may change in a monotonous manner from the current value at the beginning of the section $I_a$ via an intermediate current value within the section $I_d$ to a current value at the end of the section $I_b$. Until the intermediate current value of the section $I_d$ appears, an intermediate section duration of $t_{ad}$ elapses.

In a further step of the method according to the disclosure, an evaluation product is formed from factors that comprise at least the current value at the beginning of the section $I_a$ and the current value at the end of the section $I_b$ on the one hand as well as the duration of the section $t_{ab}$ on the other hand. Thus, at least one of the factors comprises the current value at the beginning of the section $I_a$ and/or the current value at the end of the section $I_b$ and at least another one of the factors of the duration period of the section $t_{ab}$. Both, the current value at the beginning of the section $I_a$ as well as the current value at the end of the section $I_b$ are included in the product. The product can include partial products as summands. In any case, the evaluation product features the current as a first dimension and time as a second dimension. The evaluation product may be formed by factors, which comprise at least the current value at the beginning of the section $I_a$, the intermediate current value within the section $I_d$ and the current value at the end of the section $I_b$ on the one hand as well as the duration period of the section $t_{ab}$ and the intermediate section duration period $t_{ad}$ on the other hand.

According to the disclosure, an error function of the actuator is detected by comparing the evaluation product with an evaluation product limit. The error function of the electromagnetic actuator is particularly given when there is a blockage of the electromagnetic actuator, in which the magnetic core is hindered in its movement. The disclosure is based on the surprising finding, that products, which are formed by time and amplitudes of the course of the measured current, change significantly when the actuator is blocked.

The detected error function is released, e.g. by a control unit for regulating and monitoring the actuator, which issues the error function to a superior system in order to regulate the combustion engine.

A particular advantage of the method according to the disclosure consists in the fact that it enables a secure monitoring of electromagnetic actuators during their operation and that it is thus possible to prevent damages due to blocked actuators. It is e.g. possible that significant damages are caused in a combustion engine of a motor vehicle by electromagnetic actuators in form of control valves when one of these control valves is blocked due to a defect. In particular, this could lead to an unwanted slowing down of the motor vehicle, to a sub-optimal fuel air ratio, to damages due to unconsumed gasoline in the combustion engine or to total failures of the combustion engine due to unclosed valves in the combustion chamber. Such damages can be prevented with the method according to the disclosure.

The blockage of one control valve poses a typical error. Such a blockage can be traced back to various reasons; to a production error, to inferior manufacturing quality, to insufficient lubrication during the operation, to extreme temperature conditions, to an erroneous supply of current or to wear and tear.

In an electromagnetic actuator, electric energy is transformed into mechanical energy. The current flowing through the electric coil is the result of an equalizing of various energies, in particular of electric energy, magnetic energy, kinetic energy, a force issuing against a spring that is operating within the actuator and thermal losses. The present disclosure uses the equalizing between the electric energy and the magnetic energy to detect a blockage of the actuator.

In preferred embodiments of the method according to the disclosure, the evaluation product represents a surface area of an area at one graph of the function of the current that has changed within the time period. The graph of the function is arranged within a cartesian coordinate system. The area is limited in at least two points by the graph of the function. The area is limited at least by one point of the graph of the function that is assigned to the current value at the beginning of the section and by one point of the graph of the function that is assigned to the current value at the end of the section.

The described area may be limited by a straight line that is running through a point of the graph of the function that is arranged to the current value at the beginning of the section. The first line runs parallel to an axis of the coordinate system that is assigned to the time or to an axis of the coordinate system that is assigned to the current.

The described area may be limited by a second line that is running through a point of the function graph that is assigned to the current value at the end of the section. The second line runs parallel to the axis of the coordinate system that is assigned to the time or to the axis of the coordinate system that is assigned to the current.

The first line and the second line may be aligned perpendicular towards each other. One of the two lines may be aligned parallel to the axis of the coordinate system that is assigned to the time, while the other one of the two lines is aligned to the axis of the coordinate system that is assigned to the current. Depending on which of the two lines is aligned parallel to the axis of the coordinate system that is assigned to the time, the area is situated above or below the graph for the function that is depicted in the coordinate system.

For preferred embodiments of the method according to the disclosure, one section of the graph of the function, the one that is arranged to the evaluation section, is approximated by a third line in a first partial evaluation section, while it is approximated by a fourth line in a second partial evaluation section. The first partial evaluation section and the second partial evaluation section are directly following each other. The first partial evaluation section starts at the same time as the evaluation section, while the second partial evaluation section ends at the same time as the evaluation section. The approximation of the portion of the graph of the function that is assigned to the evaluation section reduces the calculation effort for the determination of the evaluation product. The two lines represent a good approximation for typical evaluation sections of the course of the current flowing through the coil of the actuator.

The above described area may be formed by a tetragon, whose four sides are set by the first line, by the second line, by the third line and by the fourth line. The tetragon may feature a right angle, which is spanned by the first line and the second line. The surface area of this tetragon can be determined with little effort.

The above described area may be formed by a right-angled triangle with a non-straight hypotenuse. Due to its hypotenuse, the triangle may be designed in a concave manner. The legs of the triangle are provided by the first line and by the second line. The hypotenuse may be provided by the portion of the graph of the function that is assigned to the evaluation section. Alternatively, the hypotenuse may be provided by the third and fourth line together. Correspondingly, the evaluation product can be understood to be a triangle operator $\Delta$. The triangle operator $\Delta$ is an indicator, which can be recognized by the current that flows through the electric coil, for an energetic equalizing between electric energy, magnetic energy and kinetic energy within the evaluation section.

In preferred embodiments of the method according to the disclosure, the intermediate current value of the section $I_d$ is represented by the intersecting point which is positioned on the graph of the function between the third line and the fourth line.

In preferred embodiments of the method according to the disclosure, the evaluation product comprises as another factor a voltage value of an operating voltage V that is applied to the electric coil for supplying a current to the electric coil. This factor can be ignored if the voltage V is constant.

The measured current may increase during the current increase phase. The current increase phase is located in a temporal stage of the current supply. In the course of the current increase phase, the magnetic core is initially in idle mode. This temporal stage of an idle mode is followed by a temporal stage of magnetic saturation, which is also located in the current increase phase. The current increase phase may last between 0.1 ms and 10 ms; particularly preferred between 1 ms and 3 ms.

In preferred embodiments of the method according to the disclosure, the current increase phase begins after the operating voltage V has been applied to the electric coil in order to supply the electric coil with a current. After the operating voltage V has been applied to the electric coil, the current increase phase begins with or without a short temporal delay.

The current flowing through the electric coil may increase during the current increase phase from a minimum current value to a maximum current value. This increasing of the current can be overlaid with a slight AC current portion. When the maximum current value is reached, a magnetic saturation of the electromagnetic actuator has been achieved.

In preferred embodiments of the method according to the disclosure, the current increase phase is followed by a current peak phase, in which the current decreases from a current peak phase start value to a current peak phase intermediate value and then rises from a current peak phase intermediate value to a current peak phase end value. This decreasing and increasing of the current can be overlaid with a slight AC current portion.

In preferred embodiments of the method according to the disclosure, the current peak phase is followed by a holding current phase, in which the measured current decreases until it reaches a range of a holding current value and remains there.

In preferred embodiments of the method according to the disclosure, a phase-out period is positioned in the time after the current peak phase, which is particularly following the holding current phase. The temporal beginning of the phase-out period is set in that the operating voltage is removed again from the electric coil; i.e. the electromagnetic actuator is switched off. During the phase-out period, the measured current increases from a phase-out period beginning current value to a phase-out period intermediate current value, after which is decreases from the phase-out period intermediate current value to a phase-out period end current value. The phase-out period end current value may be zero.

During the current increase phase, the magnetic core may most of the time be of that current increase phase in idle mode; at least as long as the electromagnetic actuator operates without any problems.

In a first group of preferred embodiments of the method according to the disclosure, the evaluation section is located within the current increase phase.

In this first group of preferred embodiments, the current value at the beginning of the section may be provided at a deviation point. The deviation point may be determined by the following partial steps. In one partial step, a logarithmic function of the current that was measured in the current increase phase is created. The argument of the logarithmic function thus includes the current that changes within the course of the time. The logarithmic function is thus dependent on the time. In a further partial step, an approximation of the logarithmic function, which represents an earlier temporal partial section of the idle mode, is carried out by a linear function. This approximation is possible since the current in the current increase phase rises almost logarithmically as long as the magnetic core is in idle mode. The linear function is found within the result of this partial step, which represents the temporal course of the logarithmic function of the measured current during the early temporal partial section of the idle mode with great accuracy. A constant determining of a difference between the logarithmic function and the linear function beyond the early temporal partial section of the idle mode and, if necessary, until the end of the current increase phase is furthermore carried out. If necessary, the difference is already determined during the early temporal partial section of the idle mode. The difference during the early temporal partial section of the idle mode is very small, since the logarithmic function is almost linear within this partial section. After this early temporal partial section of the idle mode, the difference is getting increasingly larger and particularly towards the end of the temporal section of the idle mode, it rises significantly. Correspondingly, the deviation point is determined based on the point, when the difference reaches or surpasses a pre-defined difference value. The deviation point describes the moment, starting from when the temporal course of the measured current is no longer logarithmic, which is caused by a starting magnetic saturation. The measured current in the argument of the logarithmic function may feature a negative algebraic sign. The logarithmic function thus decreases over time. The measured current in the argument of the logarithmic function may be subtracted from the maximum current value. The argument of the logarithmic function thereby may include a positive constant as summand in order to ensure that the argument is larger than zero. The logarithmic function may refer to a decadic logarithm, wherein it is also possible that the logarithmic function has a different basis. The logarithmic function, which is referred to with the formula sign $f_{i\_log}(t)$ in the following, may be defined by the following formula:

$$f_{i\_log}(t)=\log[I_{max}-i(t)+c]$$

In this formula, i(t) refers to the measured current within the current increase phase. $I_{max}$ refers to the maximum current value. The formula sign c refers to the positive constant. The approximation may be carried out by a linear approximation of the logarithmic function representing the early temporal section of the idle mode. Different methods for a linear approximation are known and established. The end of the early temporal section of the idle mode can be pre-defined by measurements. But preferably, the end of the early temporal section of the idle mode is defined when an approximation error of the linear approximation surpasses a pre-defined maximum approximation error value.

The determining of the deviation point in time is carried out in the simplest manner, in that the moment in which the difference of the pre-defined difference value is reached, is used as the deviation point. The determining of the deviation point may be carried out in that the moment, in which the difference of the pre-defined difference value is reached, is reduced by a calibration period and is then used as deviation point. The calibration duration period may be determined ahead of time by measurements at the electromagnetic actuator.

In the first group of preferred embodiments of the method according to the disclosure, the current value at the end of the section $I_b$ is smaller than the maximum current value and is thus temporally situated before the end of the current increase phase.

In the first group of preferred embodiments of the method according to the disclosure, the evaluation product may be produced by the following triangle operator $\Delta_{increase\ phase}$:

$$\Delta_{increase\ phase}=0.5\ V\cdot((I_{ab}+I_{ad})\cdot t_{ab}\cdot I_{ab}\cdot t_{ad})$$

Hereby $I_{ab}=I_b-I_a$ and $I_ad=I_d-I_a$.

In the first group of preferred embodiments of the method according to the disclosure, the error function of the actuator is detected in the moment, when the triangle operator $\Delta_{increase\ phase}$ is at least as large as the pre-defined evaluation product limit for the triangle operator $\Delta_{increase\ phase}$.

If the triangle operator $\Delta_{increase\ phase}$ is large, this is an indication that the current i(t) rises very quickly, so that less electric energy can be transformed into other energy forms. If the triangle operator $\Delta_{increase\ phase}$ is small, this is an indication that more electric energy is transformed into kinetic energy for the movement of the magnetic core. A reduction of the triangle operator $\Delta_{increase\ phase}$ also indicates changing magnetic characteristics, such as e.g. a decreasing of the air gap, by which more electric energy is transformed.

In the first group of preferred embodiments of the method according to the disclosure, the current deviation value Iab may be used as further criteria for detecting an error function of the actuator.

In the first group of preferred embodiments of the method according to the disclosure, the value of the increase of the current i(t) after reaching Iab may be used as further criteria for detecting an error function of the actuator.

In the first group of preferred embodiments of the method according to the disclosure, a period starting with the reaching of the current increase phase start value and lasting until the reaching of the current increase phase end value may be used as further criteria for detecting an error function of the actuator.

In the first group of preferred embodiments of the method according to the disclosure, a centroid of the area that is representing the evaluation product may be used as further criteria for detecting an error function of the actuator.

In the first group of preferred embodiments of the method according to the disclosure, a center point of the area that is representing the evaluation product may be used as further criteria for detecting an error function of the actuator.

In the first group of preferred embodiments of the method according to the disclosure, the deviation point may be used as further criteria for detecting an error function of the actuator. A detecting of an error function of the electromagnetic actuator is carried out when the determined deviation point lies prior to the pre-defined regular deviation point. The defining of the regular deviation point may be carried out in that the deviation point is determined for several properly functioning electromagnetic actuators of the same construction type as the electromagnetic actuator that is to be monitored.

The earliest determined deviation point may be reduced by a tolerance value and then used as the regular deviation point.

In a second group of preferred embodiments of the method according to the disclosure, the evaluation section is located within the current peak phase.

In the second group of preferred embodiments of the method according to the disclosure, the current value at the beginning of the section may be formed by the maximum current value.

In the second group of preferred embodiments of the method according to the disclosure, the current value at the end of the section may be larger than the intermediate value within the current peak phase and is reached before the intermediate value within the current peak phase.

In the second group of preferred embodiments of the method according to the disclosure, the evaluation product may be produced by the following triangle operator $\Delta_{current\ peak\ phase}$:

$$\Delta_{current\ peak\ phase} = 0.5\ V \cdot (I_{ab} \cdot t_{ad} + I_{bd} \cdot t_{ab})$$

Hereby $I_{ab} = I_a - I_b$ and $I_{bd} = I_d - I_b$.

The error function of the actuator may be detected, when the triangle operator $\Delta_{current\ peak\ phase}$ is at the most as large as the evaluation product limit that has been pre-defined for the triangle operator $\Delta_{current\ peak\ phase}$.

If the triangle operator $\Delta_{current\ peak\ phase}$ is small, this is an indication that there is a rapid discharging of the current i(t) and that there is a low energy transformation between kinetic energy and magnetic energy. If the triangle operator $\Delta_{current\ peak\ phase}$ is larger, this is an indication that there is a slow movement of the magnetic core and low kinetic energy. An increase of the triangle operator $\Delta_{current\ peak\ phase}$ also indicates that there are changing magnetic characteristics, such as e.g. a decreasing of the air gap, by which less magnetic energy is available.

In the second group of preferred embodiments of the method according to the disclosure, the current deviation value Iab may be used as further criteria for detecting an error function of the actuator.

In the second group of preferred embodiments of the method according to the disclosure, a current deviation value $I_{min}$, which is formed by the difference between the current peak phase start value and the current peak phase intermediate value, is used as further criteria for detecting an error function of the actuator.

In the second group of preferred embodiments of the method according to the disclosure, a period $t_{min}$, starting with the reaching of the current peak phase start value and lasting until the reaching of the current peak phase intermediate value may be used as further criteria for detecting an error function of the actuator.

In the second group of preferred embodiments of the method according to the disclosure, an operator $A_{current\ peak\ phase}$ may be used as further criteria for detecting an error function of the actuator. The operator $A_{current\ peak\ phase}$ is defined as follows:

$$A_{current\ peak\ phase} = 0.5\ V \cdot [I_{ab} \cdot I_{ab} - (I_{ab} \cdot t_{ad} + I_{bd} \cdot t_{ab})]$$

In the second group of preferred embodiments of the method according to the disclosure, a ratio between the triangle operator $\Delta_{current\ peak\ phase}$ and the operator $A_{current\ peak\ phase}$ may be used as further criteria for detecting an error function of the actuator.

In the second group of preferred embodiments of the method according to the disclosure, a centroid of the area that is representing the evaluation product may be used as further criteria for detecting an error function of the actuator.

In the second group of preferred embodiments of the method according to the disclosure, a center point of the area that is representing the evaluation product may be used as further criteria for detecting an error function of the actuator.

In the second group of preferred embodiments of the method according to the disclosure, a ratio between the current deviation value $I_{ab}$ and the duration period $t_{ab}$ may be used as further criteria for detecting an error function of the actuator.

In the second group of preferred embodiments of the method according to the disclosure, a length of the graph of the function from the current peak phase intermediate value until the current peak phase end value may be used as further criteria for detecting an error function of the actuator.

In a third group of preferred embodiments of the method according to the disclosure, the evaluation section is located within the phase-out period.

In the third group of preferred embodiments of the method according to the disclosure, the phase-out period start value is used as the current value at the beginning of the section.

In the third group of preferred embodiments of the method according to the disclosure, the current value at the end of the section is smaller than the phase-out period intermediate value and is reached temporally before the phase-out period intermediate value.

In the third group of preferred embodiments of the method according to the disclosure, the evaluation product may be produced by the following triangle operator $\Delta_{phase\text{-}out\ period}$:

$$\Delta_{phase\text{-}out\ period} = 0.5\ V \cdot ((I_{ab} - I_{ad}) \cdot t_{ab} + I_{ab} \cdot t_{ad})$$

Hereby $I_{ab} = I_b - I_a$ and $I_{ad} = I_d - I_a$.

In the third group of preferred embodiments of the method according to the disclosure, the error function of the actuator may be detected in the moment, when the triangle operator $\Delta_{phase\text{-}out\ period}$ is at the most as large as the pre-defined evaluation product limit for the triangle operator $\Delta_{phase\text{-}out\ period}$.

If the triangle operator $\Delta_{phase\text{-}out\ period}$ is small, this is an indication that the current values are small. It also indicates that the current i(t) rises very quickly and that lesser electric energy is transformed into other energy forms. It further indicates a slow movement of the magnetic core and little available kinetic energy. An increase of the triangle operator $\Delta_{phase\text{-}out\ period}$ indicates an increased transformation of electric energy into magnetic energy, which may e.g. be due to an increasing of the air gap.

In the third group of preferred embodiments of the method according to the disclosure, the current deviation value $I_{ab}$ may be used as further criteria for detecting an error function of the actuator.

In the third group of preferred embodiments of the method according to the disclosure, a ratio between the current deviation value $I_{ab}$ and the duration period $t_{ab}$ may be used as further criteria for detecting an error function of the actuator.

In the third group of preferred embodiments of the method according to the disclosure, a length of the graph of the function from the phase-out period start value until the phase-out period intermediate value may be used as further criteria for detecting an error function of the actuator.

In the third group of preferred embodiments of the method according to the disclosure, a triangle operator $\Delta_{phase\text{-}out\ periodA}$ may be used as further criteria for detecting an error function of the actuator. The triangle operator $\Delta_{phase\text{-}out\ periodA}$ is defined as follows:

$$\Delta_{phase\text{-}out\ periodA} = 0.5 \cdot ((I_{ab}+I_{ad}) \cdot t_{ab} - I_{ab} \cdot t_{ad})$$

In the third group of preferred embodiments of the method according to the disclosure, the phase-out period intermediate value and the duration period until it is reached may be used as further criteria for detecting an error function of the actuator.

In the third group of preferred embodiments of the method according to the disclosure, a further evaluation section, which is situated in the latter part of the phase-out period, may be used, i.e. after reaching the phase-out period intermediate value. The phase-out period intermediate value may be used as current value at the beginning of the section $I_a$. The current value at the end of the section $I_b$ may be smaller than the phase-out period intermediate value and is reached temporally before the phase-out period end value.

In the third group of preferred embodiments of the method according to the disclosure, a triangle operator $\Delta_{phase\text{-}out\ periodB}$ for the latter part of the phase-out period may be used as further criteria for detecting an error function of the actuator. The triangle operator $\Delta_{phase\text{-}out\ periodB}$ is defined as follows:

$$\Delta_{phase\text{-}out\ periodB} = 0.5 \cdot ((I_{ab}+I_{ad}) \cdot t_{ab} - I_{ab} \cdot t_{ad})$$

Hereby $I_{ab}=I_a-I_b$ and $I_{ad}=I_a-I_d$.

In the third group of preferred embodiments of the method according to the disclosure, a triangle operator $\Delta_{phase\text{-}out\ periodC}$ for the latter part of the phase-out period may be used as further criteria for detecting an error function of the actuator. The triangle operator $\Delta_{phase\text{-}out\ periodC}$ is defined as follows:

$$\Delta_{phase\text{-}out\ periodC} = 0.5 \cdot ((I_{ab}-I_{ad}) \cdot t_{ab} + I_{ab} \cdot t_{ad})$$

Hereby $I_{ab}=I_a-I_b$ and $I_{ad}=I_a-I_d$.

In the third group of preferred embodiments of the method according to the disclosure, a sum of the triangle operators $\Delta_{phase\text{-}out\ period}$, $\Delta_{phase\text{-}out\ periodA}$, $\Delta_{phase\text{-}out\ periodB}$ and $\Delta_{phase\text{-}out\ periodC}$ may be used as further criteria for detecting an error function of the actuator.

In the third group of preferred embodiments of the method according to the disclosure, a centroid of the area that is representing the evaluation product may be used as further criteria for detecting an error function of the actuator.

In the third group of preferred embodiments of the method according to the disclosure, a center point of the area that is representing the evaluation product may be used as further criteria for detecting an error function of the actuator. The center point refers to the temporal point in the middle and possibly to an intermediate value of the measured current within the evaluation section.

In the third group of preferred embodiments of the method according to the disclosure, the duration of the intermediate value may be used as further criteria for detecting an error function of the actuator.

In the third group of preferred embodiments of the method according to the disclosure, at least one ratio between the triangle operators may be used as further criteria for detecting an error function of the actuator. At least one of the following ratios is created:

$\Delta_{phase\text{-}out\ period}/\Delta_{phase\text{-}out\ periodA}$, $\Delta_{phase\text{-}out\ period}/\Delta_{phase\text{-}out\ periodB}$, $\Delta_{phase\text{-}out\ period}/\Delta_{phase\text{-}out\ periodC}$, $\Delta_{phase\text{-}out\ periodA}/\Delta_{phase\text{-}out\ periodB}$ and $\Delta_{phase\text{-}out\ periodC}/\Delta_{phase\text{-}out\ periodB}$.

The criteria that may be applied for detecting an error function of the actuator that were mentioned for the three groups of preferred embodiments, may also be used in a combination. The criteria for detecting an error function of the actuator that were mentioned for the three groups of preferred embodiments may also be applied in a group-transcending manner in combination, i.e. several of the criteria that were mentioned for the three groups of preferred embodiments for detecting an error function of the actuator are used in combination with each other.

The control unit according to the disclosure serves for the regulating and monitoring of an electromagnetic actuator and is configured for operating the method according to the disclosure. The control unit according to the disclosure may be configured for operating preferred embodiments of the method according to the disclosure.

BRIEF DESCRIPTION OF THE DRAWINGS

Further details, advantages and further developments of the disclosure can be derived from the following description of preferred embodiments of the disclosure, with reference to the drawings. It is shown.

DETAILED DESCRIPTION

Figure 1:
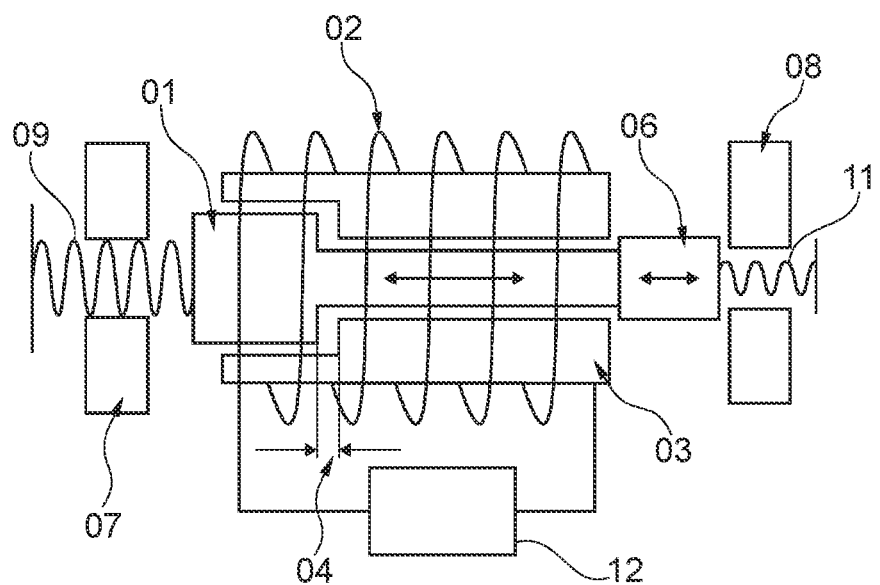
FIG. 1 a control valve that is to be monitored according to a preferred embodiment of a method according to the disclosure in a schematic depiction.

FIG. 1 depicts a control valve that is to be monitored according to a preferred embodiment of a method according to the disclosure in a schematic depiction. It represents an electromagnetic actuator and comprises a moveable magnetic core 01, which can be moved within an electric coil 02. The coil 02 is placed on a solid magnetic core 03, within which the moveable magnetic core 01 can be shifted. An air gap 04 is formed between the moveable magnetic core 01 and the solid magnetic core 03.

A valve body 06 is attached to the moveable magnetic core 01, and the valve body 06 is a component of a valve that is not depicted in more detail. The shifting movement of the moveable magnetic core 01 with the valve body 06 is limited by a first limit stop 07 and by a second limit stop 08. The shifting movement of the moveable magnetic core 01 with the valve body 06 is cushioned by a first spring 09 and by a second spring 11.

The electric coil 02 is connected to a control unit 12, by which a current can be supplied to coil 02 of the control valve. To accomplish this, an operating voltage V is applied to coil 02 by the control unit 12, after which a current that is dependent on time i(t) flows through coil 02. Control unit 12 is configured to carry out the method according to the disclosure, which will be explained in the following.

Figure 2:
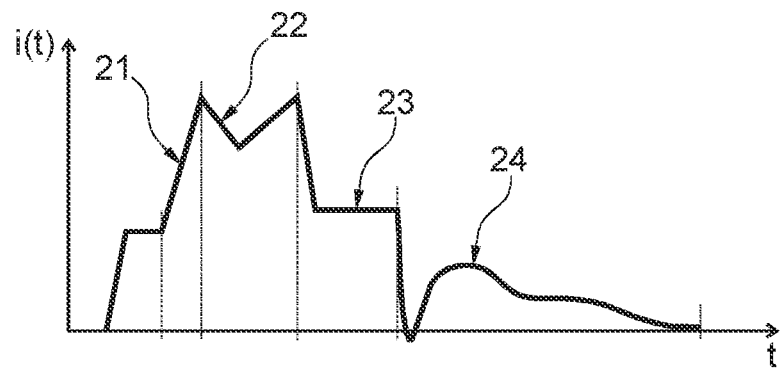
FIG. 2 a temporal course of the current for supplying a current to the control valve as it is shown in FIG. 1.

FIG. 2 depicts a temporal course of the current i(t) as it was described with reference to FIG. 1. After the operating voltage V has been applied, the current i(t) rises during the current increase phase 21 and passes through a current peak phase 22, after which it remains in a holding current phase 23 until the end of the application of the operating voltage V. After the application of the operating voltage V, a phase-out period 24 follows.

Figure 3:
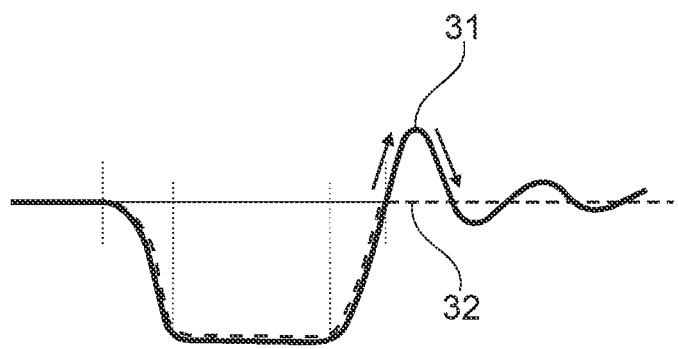
FIG. 3 a temporal course of a movement of a magnetic core as it is shown in FIG. 1 and of a valve body as it is shown in FIG. 1 while the control valve is supplied with a current.

FIG. 3 depicts a temporal course of a movement of the magnetic core 01 that is shown in FIG. 1 and of the valve body 06 that is shown in FIG. 1 while the control valve is supplied with a current. The temporal course of the movement of the magnetic core 01 that is shown in FIG. 1 is illustrated by a solid line 31 in the diagram. The temporal course of the movement of the valve body 06 that is shown in FIG. 1 is illustrated by a dashed line 32 in the diagram.

Figure 4:
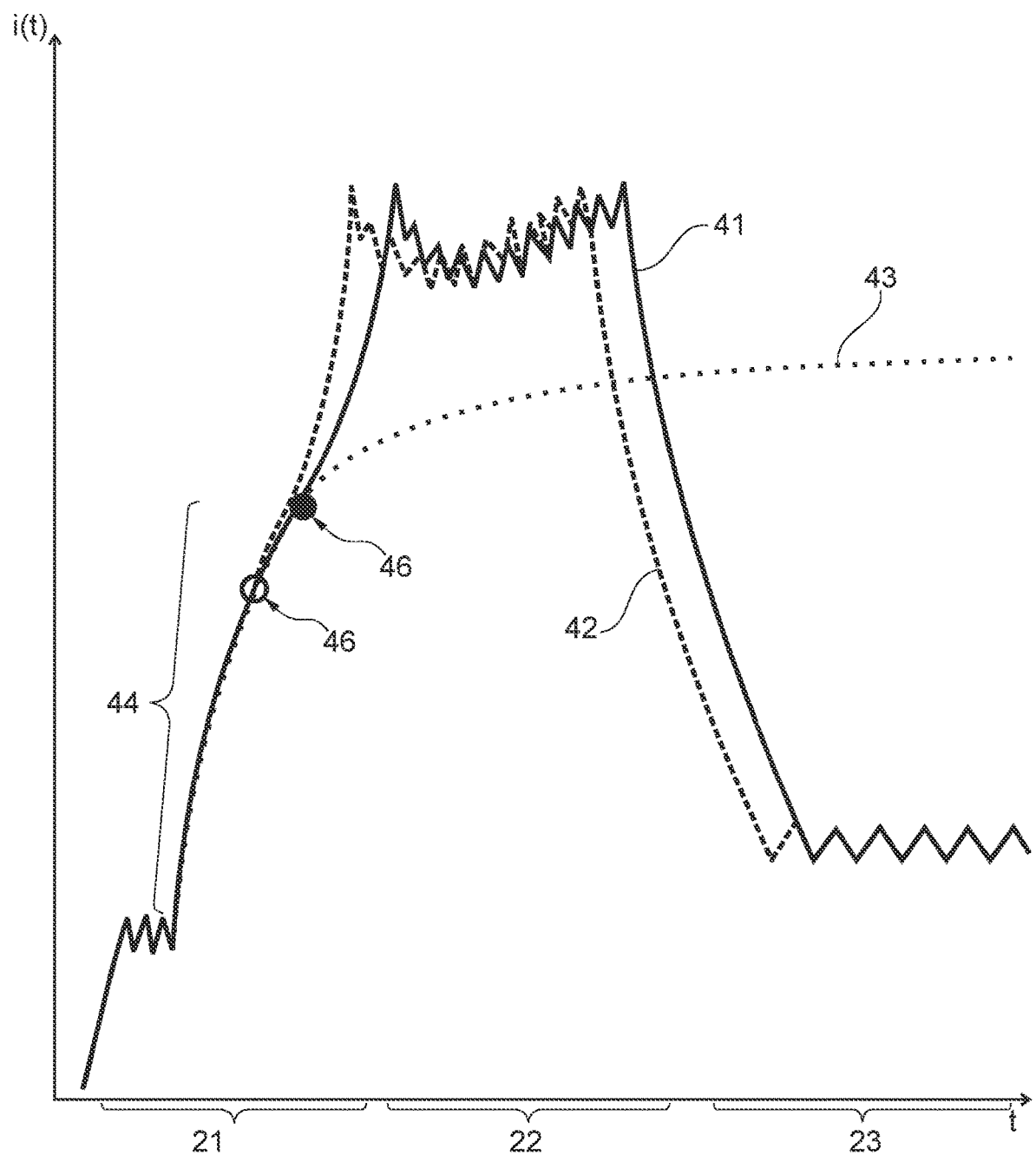
FIG. 4 an excerpt of the course of the current as it is shown in FIG. 2 in detail with a deviation point in accordance with a preferred embodiment of the method according to the disclosure.

FIG. 4 depicts an excerpt of the course of the current i(t) as it is shown in FIG. 2 in detail. This course is depicted by a solid line 41 for the case that the control valve functions without any problems. This course is depicted by a dashed line 42 for the case that the control valve is blocked. A dotted line 43 illustrates the case in which the control valve and its current supply is dimensioned in such a way, that it would not reach a magnetic saturation in the control valve, and that the control valve would furthermore be blocked. However, control valves are generally dimensioned in such way that they operate near or in their electromagnetic saturation. The current i(t) initially rises exponentially, but due to the electromagnetic saturation, there is even a steeper rise. In a control valve that functions without any problems, a portion of the electric energy is transformed into kinetic energy. In a blocked control valve, the electric energy leads to an electromagnetic saturation in an increased measure, so that the exponential course of the current i(t) is left earlier.

During the idle mode phase 44, the depicted magnetic core 01 (shown in FIG. 1) is still in idle mode. In the idle mode phase 44, the current i(t) has a logarithmic course. After the idle mode phase 44, the magnetic saturation of the control valve sets in, so that the current i(t) rises more than it would according to the logarithmic course. The setting in of this increased gradient of the current i(t) starts at deviation point 46. If the control valve is blocked, the magnetic saturation, as it was described above, sets in earlier, so that the deviation point 46 comes earlier. According to a preferred embodiment of the method according to the disclosure, the deviation point 46 is determined while the control valve is supplied with a current. If it lies temporally before a pre-defined regular deviation point, then a blockage of the control valve is detected according to preferred embodiments of the method according to the disclosure, and an error message is released.

Figure 5:
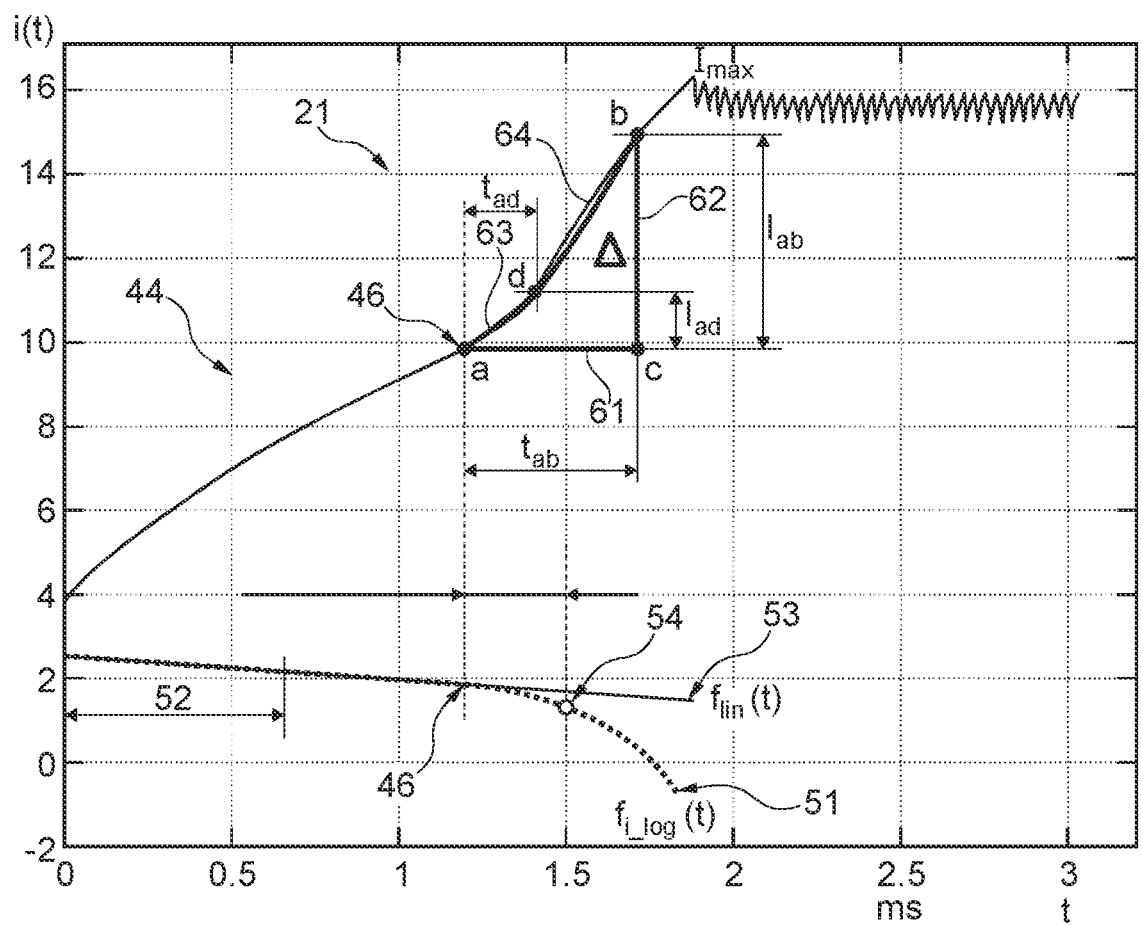
FIG. 5 a current increase phase of the course of the current as it is shown in FIG. 4 with a surface area that is to be determined in accordance with a preferred embodiment of the method according to the disclosure.

FIG. 5 depicts in particular the current increase phase 21 of the course of the current i(t) as it is shown in FIG. 4, wherein the determination of the deviation point 46 is illustrated. At first, a logarithmic function $f_{i\_log}(t)$ of the temporal course of the measured current i(t) is determined, which is depicted by the dashed line 51. In order to form the logarithmic function $f_{i\_log}(t)$, it is necessary to consider in addition to the current i(t) also a maximum current value $I_{max}$. A positive constant c as summand in the argument of the logarithmic function $f_{i\_log}(t)$ ensures that the argument is always positive.

The logarithmic function $f_{i\_log}(t)$ is determined as follows:

$$f_{i\_log}(t) = \log[i(t) - I_{max} + c]$$

Initially, the logarithmic function $f_{i\_log}(t)$ has a linear course. In an early temporal partial section 52 of the idle mode phase, a linear approximation of the logarithmic function $f_{i\_log}(t)$ is carried out, which maintains a linear function $f_{lin}(t)$ in its result, which is depicted by a thin solid line 53. At a difference value point 54, the logarithmic function $f_{i\_log}(t)$ and the linear function $f_{lin}(t)$ deviate from each other by a pre-defined difference value. A calibration period is subtracted from this difference value point 54, by which deviation point 46 is maintained.

During the current increase phase 21 of the course of the current i(t), a surface area is further determined according to a preferred embodiment of the method according to the disclosure, which represents a triangle operator Δ. The triangle operator Δ is determined in an evaluation section, which begins at a point a that coincides with the deviation point 46 and which increases until a point b that is nearly the current peak $I_{max}$. The evaluation section lasts for a duration period of $t_{ab}$. The current i(t) rises during this evaluation section by a current difference value $I_{ab}$. Between point a and point b, a point d is selected on the graph of the function of the current i(t). The temporal section from point a until point d represents one evaluation partial section, which lasts for a duration of $t_{ad}$. At point d, the current i(t) is larger than at point a by a current deviation value $I_{ad}$. A line 61 runs through point a, which is aligned parallel to the axis of the time t. A second line 62 runs through point b, which is aligned parallel to the axis of the current i(t). The first line 61 and the second line 62 intersect in a point c. A third line 63 runs through points a and d. A fourth line 64 runs through points d and b. The first line 61, the second line 62, the third line 63 and the fourth line 64 span a tetragon, which can also be viewed as a right-angled triangle with a non-straight hypotenuse, which is made up by the third line 63 and the fourth line 64. The hypotenuse that is made up by the third line 63 and the fourth line 64 represents an approximation to the function course of the current i(t) within the evaluation section. The surface area of the right-angled triangle with the non-straight hypotenuse forms the triangle operator Δ. In line with the disclosure, a blockage of the control valve is detected, when the triangle operator Δ, that was formed for the current increase phase, is at least as large as the pre-defined evaluation product limit.

Figure 6:
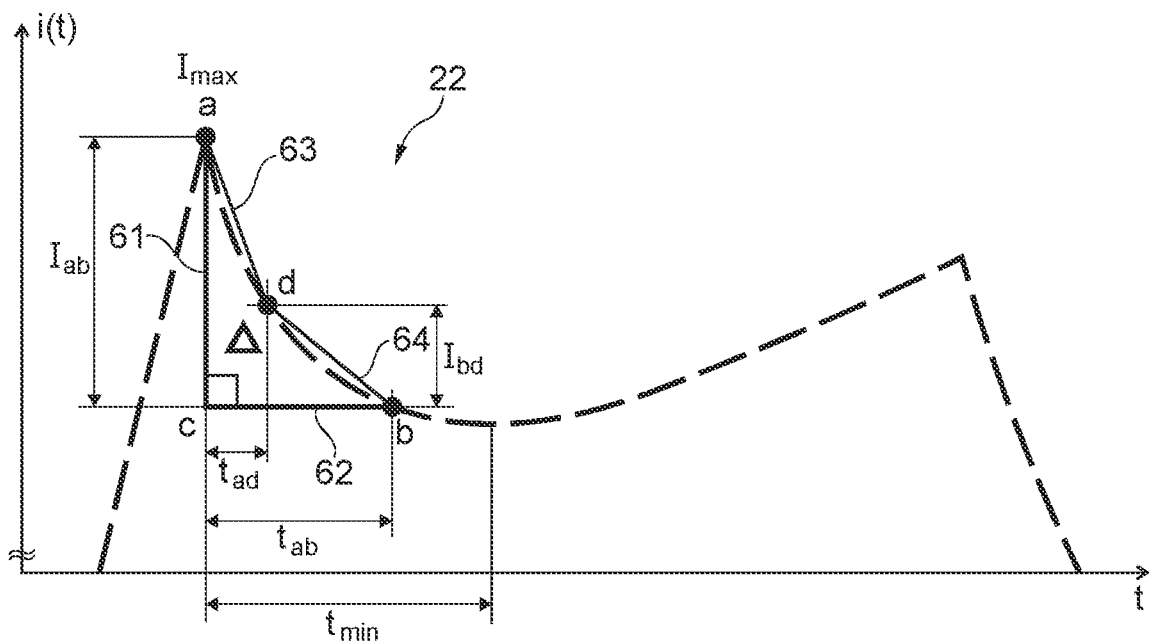
FIG. 6 a peak current phase of the course of the current as it is shown in FIG. 2 with a surface area that is to be determined in accordance with a preferred embodiment of the method according to the disclosure.

FIG. 6 depicts the peak current phase 22 of the course of the current i(t) as shown in FIG. 2 with a surface area that is to be determined in accordance with a preferred embodiment of the method according to the disclosure, which represents a further triangle operator Δ. The triangle operator Δ is determined in a further evaluation section, in which the current i(t) sinks at a point a from one current peak phase start value until almost the current peak phase intermediate value at a point b. The current peak phase start value refers to the current peak $I_{max}$. The evaluation section again lasts for a duration period of $t_{ab}$. The current i(t) sinks during this evaluation section by a current difference value $I_{ab}$. Between point a and point b, a point d is once again selected on the graph of the function of the current i(t). The temporal section from point a until point d represents one evaluation partial section that last for a duration period of $t_{ad}$. At point d, the current i(t) is larger than at point b by a current deviation value $I_{bd}$. A first line 61 runs again through point a, it is however aligned parallel to the axis of the current i(t). A second line 62 again runs through point b, however it is aligned parallel to the axis of the time t. The first line 61 and the second line 62 again intersect in a point c. A third line 63 also runs through points a and d. A fourth line 64 again runs through points d and b. The first line 61, the second line 62, the third line 63 and the fourth line 64 span a tetragon, which can also be viewed as a right-angled triangle with a non-straight hypotenuse, which is made up of the third line 63 and the fourth line 64. The hypotenuse that is made up of the third line 63 and the fourth line 64 represents an approximation to the function course of the current i(t) within the evaluation section. The surface area of the right-angled triangle with the non-straight hypotenuse again forms the triangle operator Δ. In line with the disclosure, a blockage of the control valve is detected, when the triangle operator Δ, that was formed for the current peak phase, is at the most as large as the pre-defined evaluation product limit.

Figure 7:
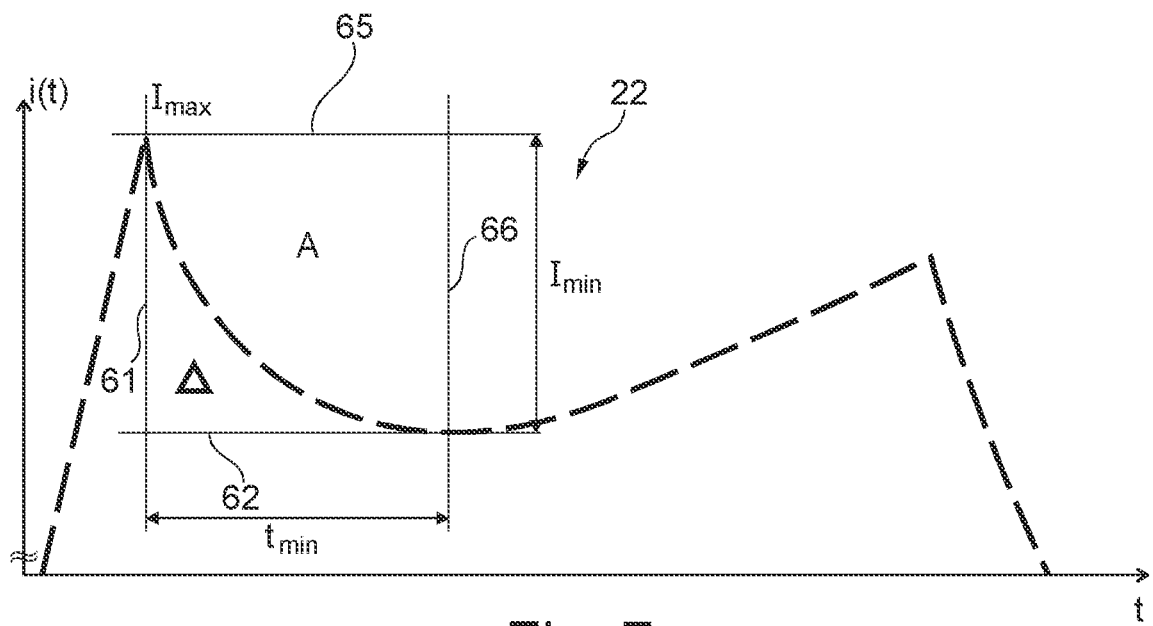
FIG. 7 the current peak phase as it is shown in FIG. 6 with a surface area that is to be determined in accordance with a preferred embodiment of the method according to the disclosure.

FIG. 7 depicts the current peak phase 22 as shown in FIG. 6 with a surface area that is to be determined in accordance with a preferred embodiment of the method according to the disclosure. A deviating evaluation section is determined, in which the current i(t) sinks from the current peak phase start value until completely reaching the current peak phase intermediate value. This evaluation section lasts for a duration period of $t_{min}$. During this evaluation section, the current i(t) sinks by a current deviation value $I_{min}$. A first line 61 again runs through the point of the current peak phase start value, which is aligned parallel to the axis of the current i(t). A second line 62 runs again through the point of the current peak phase intermediate value, which is aligned parallel to the axis of the time t. In accordance with an alternatively preferred embodiment, the surface area of an area is determined, which is limited by the first line 61, the second line 62 and the graph of the function of the current i(t). This surface area represents an alternatively preferred triangle operator Δ. A fifth line 65 runs through the current peak phase start value, which is aligned parallel to the axis of the time t. A sixth line 66 runs through the point of the current peak phase intermediate value, which is aligned parallel to the axis of the current i(t). In accordance with an alternatively preferred embodiment, the surface area of an area is determined, which is limited by the fifth line 65, the sixth line 66 and the graph of the function of the current i(t). This surface area represents an operator A, which is used according to an alternatively preferred embodiment as criteria for determining an error function of the actuator.

Figure 8:
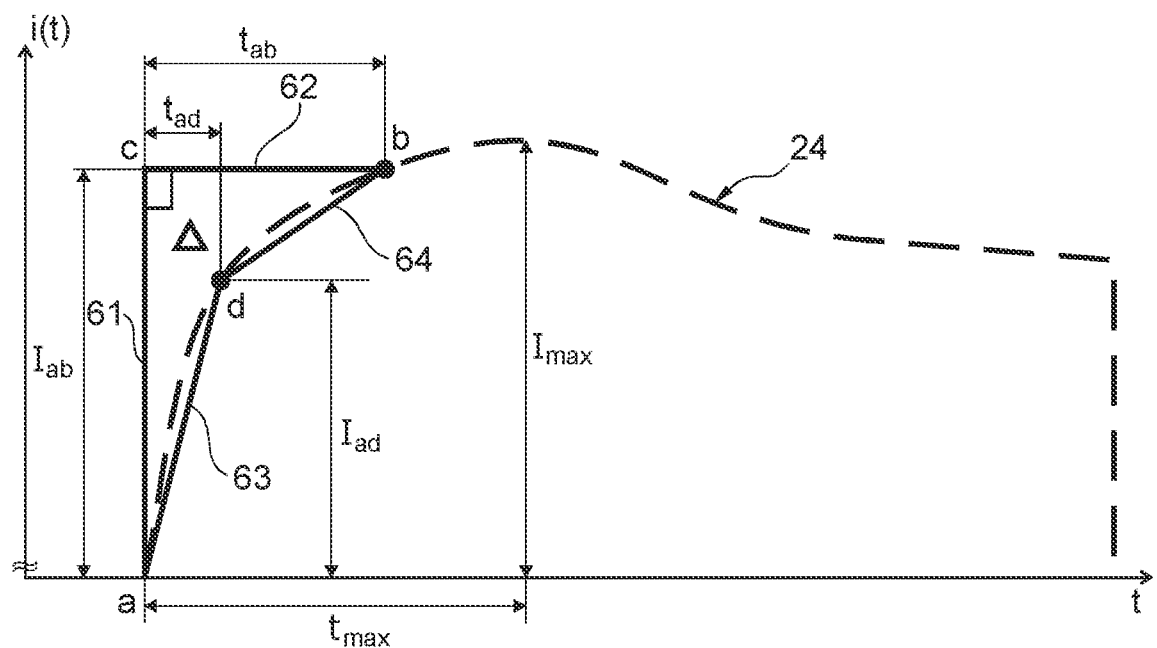
FIG. 8 a phase-out period of the course of the current as it is shown in FIG. 2 with a surface area that is to be determined in accordance with a preferred embodiment of the method according to the disclosure.

FIG. 8 depicts the phase-out period 24 of the course of the current i(t) as shown in FIG. 2 with a surface area that is to be determined in accordance with a preferred embodiment of the method according to the disclosure, which represents a further triangle operator Δ. The triangle operator Δ is determined in a further evaluation section, in which the current i(t) rises at a point a from one current value at the start of the phase-out period until a point b to almost a maximum intermediate current value within the phase-out period. The evaluation section again lasts for a duration period of $t_{ab}$. The current i(t) rises during this evaluation section by a current difference value $I_{ab}$. Between point a and point b, a point d is once again selected on the graph of the function of the current i(t). The temporal section from point a until point d represents one evaluation partial section, which lasts for a duration period of $t_{ad}$. At point d, the current i(t) is larger than at point a by a current deviation value $I_{ad}$. A first line 61 runs again through point a, which is aligned parallel to the axis of the current i(t). A second line 62 again runs through point b, which is aligned parallel to the axis of the time t. The first line 61 and the second line 62 again intersect in a point c. A third line 63 also runs through points a and d. A fourth line 64 again runs through points d and b. The first line 61, the second line 62, the third line 63 and the fourth line 64 span a tetragon, which can also be viewed as a right-angled triangle with a non-straight hypotenuse, which is made up of the third line 63 and the fourth line 64. The hypotenuse that is made up of the third line 63 and the fourth line 64 represents an approximation to the function course of the current i(t) within the evaluation section. The surface area of the right-angled triangle with the non-straight hypotenuse again forms the triangle operator Δ. In line with the disclosure, a blockage of the control valve is detected, when the triangle operator Δ, that was formed for the current peak phase, is at the most as large as the pre-defined evaluation product limit.

Figure 9:
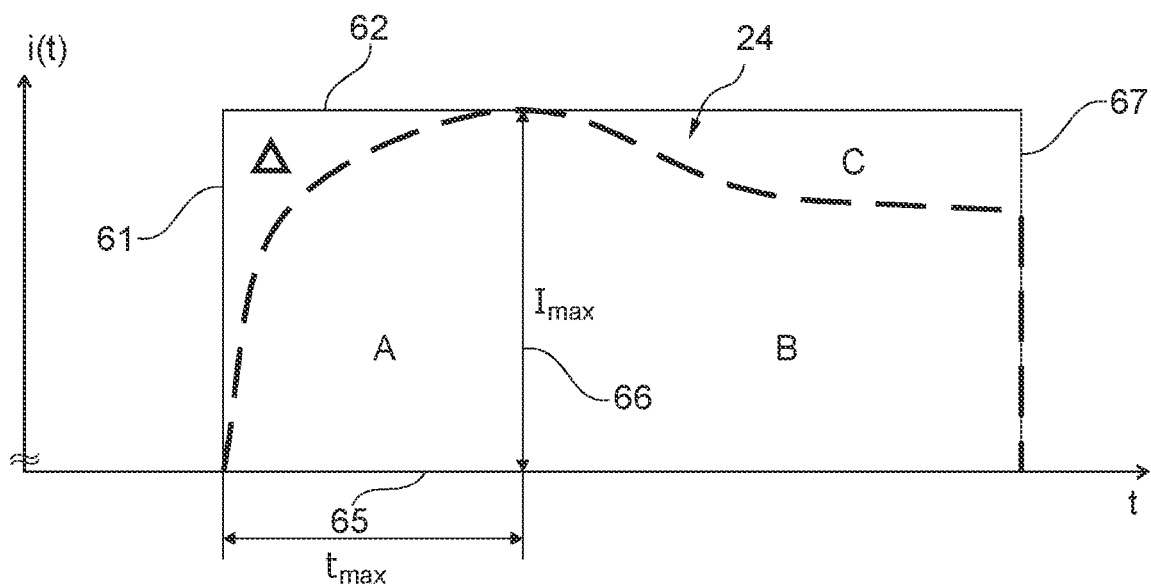
FIG. 9 the phase-out period as it is shown in FIG. 8 with further surface areas that are to be determined in accordance with a preferred embodiment of the method according to the disclosure.

FIG. 9 depicts the current peak phase 24 as shown in FIG. 8 with further surface areas that are to be determined in accordance with further preferred embodiments of the method according to the disclosure. A deviating evaluation section is determined, in which the current i(t) rises from the current value at the beginning of the phase-out period until completely reaching the intermediate current value within the phase-out period. This evaluation section lasts for a duration period of $t_{max}$. During this evaluation section, the current i(t) rises by a current deviation value $I_{max}$. A fifth line 65 runs through the current value at the beginning of the phase-out period, which is aligned parallel to the axis of the time t. A sixth line 66 runs through the point of the maximum intermediate current value within the phase-out period, which is aligned parallel to the axis of the current i(t). In accordance with an alternatively preferred embodiment, the surface area of an area A is determined, which is limited by the fifth line 65, the sixth line 66 and the graph of the function of the current i(t). This surface area represents a triangle operator $\Delta_A$, which is used according to an alternatively preferred embodiment as criteria for determining an error function of the actuator.

A deviating evaluation section may be determined alternatively or additionally, in which the current i(t) sinks from the maximum intermediate current value within the phase-out period until an end current value of the phase-out period. A seventh line 67 runs through the end current value of the phase-out period, which is aligned parallel to the axis of the current i(t). In accordance with an alternatively preferred embodiment, the surface area of an area B is determined, which is limited by the fifth line 65, the sixth line 66, the seventh line 67 and the graph of the function of the current i(t). This surface area represents an alternatively preferred triangle operator $\Delta_B$. In accordance with a further alternatively preferred embodiment, the surface area of an area C is determined, which is limited by the second line 62, the seventh line 67 and the graph of the function of the current i(t). This surface area represents an alternatively preferred triangle operator $\Delta_C$. The various triangle operators and further operators be used in line with the disclosure individually or in combination as criteria for detecting an error function of the actuator.

LIST OF REFERENCE SIGNS 01 moveable magnetic core
02 electric coil
03 solid magnetic core
04 air gap
05 —
06 valve body
07 first limit stop
08 second limit stop
09 first spring
10 —
11 second spring
12 control unit
20 —
21 current increase phase
22 current peak phase
23 holding current phase
24 phase-out period
30 —
31 movement of the magnetic core (straight line)
32 movement of the valve body (dashed line)
40 —
41 course of the current i(t) (straight line)
42 course of the current i(t) when control valve is blocked (dashed line)
43 course of the current i(t) without magnetic saturation (dotted line)
44 idle mode phase
45 —
46 deviation point
50 —
51 logarithmic function $f_{i\_log}(t)$ (dashed line)
52 early temporal partial section of the idle mode phase
53 linear function $f_{lin}(t)$ (thin straight line)
54 difference value point
60 —
61 first line
62 second line
63 third line
64 fourth line
65 fifth line
66 sixth line
67 seventh line

The invention claimed is:

1. A method for monitoring the function of an electromagnetic actuator, comprising:
shifting a magnetic core within the electromagnetic actuator by supplying a current to an electric coil, wherein the magnetic core shifts between a first spring and a second spring, wherein a first surface of the magnetic core is in contact with the first spring and a second surface of the magnetic core is in contact with the second spring;
measuring of a temporally varying current flowing through the electric coil;
selecting of a temporal evaluation section of a course of the temporally varying current, wherein the temporally varying current changes from a current value at a beginning of the temporal section to a current value at an end of the section, wherein the temporal evaluation section lasts for a duration period;
forming of an evaluation product from factors which comprise at least the current value at the beginning of the section and the current value at the end of the section as well as the duration period of the section; and
detecting of an error function of the actuator by comparing the evaluation product with an evaluation product limit;
wherein the evaluation product represents a surface area of an area at a graph of a function of the temporally varying current, wherein the area is limited at least by one point of the graph of the function that is assigned to the current value of the beginning of the section and by one point of the graph of the function that is assigned to the current value of the end of the section;
wherein the area is limited by a first line that runs through the point of the graph of the function that is assigned to the current value of the beginning of the section; and that the area is limited by a second line that runs through the point of the graph of the function that is assigned to the current value of the end of the section;
wherein the area is furthermore limited by a portion of the graph of the function that is assigned to the evaluation section; and
wherein a portion of the graph of the function that is assigned to the evaluation section is approximated by a third line in a first evaluation partial section; and that the portion of the graph of the function that is assigned to the evaluation section is approximated by a fourth line in a second evaluation partial section; wherein the area is formed by a tetragon, which sides are made up by the first line, by the second line, by the third line and by the fourth line.

2. The method of claim 1, wherein the current that is flowing through the electric coil rises during a current increase phase, while along its course, the magnetic core is initially in an idle mode; wherein the current increase phase is followed by a current peak phase, in which the current decreases from a current peak phase start value to a current peak phase intermediate value and then rises from a current peak phase intermediate value to a current peak phase end value; wherein the current peak phase is followed by a holding current phase, in which the current decreases until it reaches a range of a holding current value and remains there; and wherein the holding current phase is followed by a phase-out period, in which the current rises from a phase-out period beginning current value to a phase-out period intermediate current value and then sinks from the phase-out period intermediate current value to a phase-out period end current value.

3. The method of claim 2, wherein the evaluation section is located within the current increase phase; wherein the current value at the end of the section is smaller than the maximum current value and is temporally situated prior to the end of the current increase phase; and wherein the current value at the beginning of the section is provided at a deviation point, which is determined by the following partial steps:
creating a logarithmic function of the current that was measured in the current increase phase;
approximating of the logarithmic function, which represents an early temporal partial section of the idle mode, by a linear function;
a constant determining of a difference between the logarithmic function and the linear function beyond the early temporal partial section of the idle mode; and
determining the deviation point based on the point, in which the difference reaches a pre-defined difference value.

4. The method of claim 3, wherein the evaluation section is located within the current peak phase, wherein the current value at the end of the section is larger than the intermediate value within the current peak phase and is reached prior to the intermediate value within the current peak phase.

5. The method of claim 4, wherein the evaluation section is located within the phase-out period, wherein a phase-out period start value is used as the current value at the beginning of the section, and wherein the current value at the end of the section is smaller than the phase-out period intermediate value and is reached temporally before the phase-out period intermediate value.

6. A method for monitoring a function of an electromagnetic actuator, comprising:
measuring of a current flowing through an electric coil wrapped around a magnetic core of the electromagnetic actuator, wherein the magnetic core shifts between a first spring and a second spring, wherein a first surface of the magnetic core is in contact with the first spring and a second surface of the magnetic core is in contact with a valve body;
selecting of a temporal evaluation section of a course of the current, wherein the current changes from a current value at a beginning of the temporal section to a current value at an end of the section, wherein the temporal evaluation section lasts for a duration period;
forming of an evaluation product from at least the current value at the beginning of the section, the current value at the end of the section, and the duration period of the section; and
detecting an error function of the actuator by comparing the evaluation product with an evaluation product limit.

7. The method of claim 6, wherein the error function is detected when there is a blockage of the electromagnetic actuator.

8. The method of claim 6, wherein the method further includes outputting to the error function to regulate a combustion engine.

9. The method of claim 6, wherein the evaluation product includes a voltage value of an operating voltage applied to the electric coil for supplying current to the electric coil.

10. The method of claim 6, wherein the evaluation product represents a surface area of an area at a graph of a function of the current that has changed within the duration period.

11. The method of claim 10, wherein the area is limited at least by one point of the graph of the function that is assigned to the current value at the beginning of the section and by one point of the graph of the function that is assigned to the current value at the end of the section.

12. A control valve, comprising:
a magnetic core and an electric coil, wherein the magnetic core is configured to be moved by supplying a current to the electric coil to allow electric energy to be transformed into mechanical energy and an electromagnetic actuator operates a valve body that is to be moved, wherein the magnetic core is located between a first spring and a second spring, and a first surface of the magnetic core is in contact with the first spring and a second surface of the magnetic core is contact with the valve body; and
a controller configured to:
measure a current flowing through the electric coil;
select a temporal evaluation section of a course of the current, wherein the current changes from a current value at a beginning of the temporal section to a current value at an end of the section, wherein the temporal evaluation section lasts for a duration period;
form an evaluation product from at least the current value at the beginning of the section, the current value at the end of the section, and the duration period of the section; and
detect an error function of the actuator by comparing the evaluation product with an evaluation product limit.

13. The control valve of claim 12, wherein the magnetic core is configured to move in an axial direction of the electric coil.

14. The control valve of claim 12, wherein the evaluation product includes a voltage value of an operating voltage applied to the electric coil for supplying current to the electric coil.

* * * * *